(12) United States Patent
Chen et al.

(10) Patent No.: US 7,723,763 B2
(45) Date of Patent: May 25, 2010

(54) COLOR PHOTODETECTOR APPARATUS WITH MULTI-PRIMARY PIXELS

(75) Inventors: Hsuen-Li Chen, Taipei (TW);
Kuan-Sheng Lai, Hsinchu (TW);
Wen-Yun Wang, Taipei (TW)

(73) Assignee: National Taiwan University, Taipei (TW)

( * ) Notice: Subject to any disclaimer, the term of this patent is extended or adjusted under 35 U.S.C. 154(b) by 266 days.

(21) Appl. No.: 11/979,004

(22) Filed: Oct. 30, 2007

(65) Prior Publication Data
US 2008/0290434 A1 Nov. 27, 2008

(30) Foreign Application Priority Data
May 23, 2007 (TW) .............................. 96118301 A

(51) Int. Cl.
*H01L 31/062* (2006.01)
(52) U.S. Cl. ................. 257/291; 257/292; 257/E27.134

(58) Field of Classification Search ................. 257/291, 257/292, 294, 434, 435, E31.121, E31.122, 257/E31.123, E27.134
See application file for complete search history.

(56) References Cited

U.S. PATENT DOCUMENTS

| | | | |
|---|---|---|---|
| 6,852,562 B1 * | 2/2005 | Hopper et al. | ................. 438/57 |
| 2009/0078977 A1 * | 3/2009 | Kitano et al. | ................ 257/292 |
| 2009/0146198 A1 * | 6/2009 | Joe et al. | ..................... 257/292 |

* cited by examiner

*Primary Examiner*—Minh-Loan T Tran
(74) *Attorney, Agent, or Firm*—Bacon & Thomas, PLLC

(57) ABSTRACT

The invention discloses the color photodetector with multi-primary is introduced to detect the incident light with specific wavelength regimes. Combining the surface plasma resonance effect with photodetector can be utilized to enhance the photo-responsivity of the demanded light wavelength and also can substitute the conventionally color filter and infrared cutter. In this invention, a novel integrated photo-detector that can be realized in commercial CMOS process for achieving low-cost consideration.

6 Claims, 6 Drawing Sheets

COLOR PHOTODETECTOR APPARATUS WITH MULTI-PRIMARY PIXELS

BACKGROUND OF THE INVENTION

1. Field of the Invention

The invention relates to a photodetector apparatus, more particularly to a color photodetector apparatus with multi-primary pixels.

2. Description of the Prior Art

Normally, when the photodetector (sensor) of digital camera and the pick up head of digital versatile disc (DVD) are conducting the photodetection, especially detecting red, green and blue (RGB) incident light, an extra optical color filter is coated on the photodetector, in order to achieve the effect of photodetection.

At present all photodetectors normally are made form the semiconductors. Especially there are two kinds of semiconductor collected as the photodetector. One is photoconductor, which uses the photo-conductivity property. The other is photodiode, which uses the diode structure property. The photodetector uses the sensor to absorb photo energy and transfer to the electronic signal, in order to measure the photo flux or photo power. Thus, for the photodetector, the existing silicon-based or other III-V compound semiconductor based photodiode or phototransistor can be applied.

FIG. 1 shows the conventional structure of photodetector. It consists of P-type (or N-type) semiconductor substrate 101, $N^+$ polar area (or $P^+$ polar area) 102, optical-electrical conversion area 103, oxide layer 104, metal layer 105 as detector terminal etc. When the incident light reaches to the surface of metal layer, it will be absorbed or reflected completely without penetrating.

As for the conventional structure of photodetector, due to the detecting wavelength of conventional pure silicon-based photodetector is about 300 nm~1100 nm, so that the incident light can not penetrate through the finger shape metal connecting wire of photodetector, which causes the photodetection area under the finger shape metal connecting wire can not generate the current effectively. Therefore the filling factor, that is the ratio of effective detecting area and total area of photodetector, can not be raised effectively.

In order to detect red, green and blue light completely by the pick up head, three photodetectors should be collected as the conventional way. An optical color filter with respect a specific wavelength will be coated on each photodetector, respectively, in order to form a complete detecting pixel. According to the above-mentioned requirement, it is necessary to add red, green and blue color filters on a photodectors.

The conventional structure can not be achieved by the existing low-cost complementary metal-oxide-semiconductor (CMOS) manufacturing process. Another related color filter with optical thin film process is required, which increases the total cost and decreases the throughput.

Due to the demand of digital camera is ardent in recent years (the photodetector is key component in camera), the integrated CMOS technology has to be developed to conduct mass production of filter film. The production cost shall be low and the production time shall be short. The visual light shall be able to be detected, and red, green and blue light shall be able to be distinguished. Thus the research and development of related filter film is urgent and required.

The retrieval shows Taiwan Patent No. I268290 relates to "Preparation Method of Silicon-based Film and its Photodetector". Though it is a preparation method of photodetector, it does not reveal the related structure of photodetector, and the surface plasma theory is not used for the design of color photodetector with multi-primary pixels.

The retrieval for the related patent database of United States Patent Office also shows U.S. Pat. No. 6,452,242 relates to "Multi color detector". Though it has the microstructure of photodetector, the surface plasma theory is not used for the design of color photodetector with multi-primary pixels.

SUMMARY OF THE INVENTION

The foregoing, as well as additional objects, features and advantages of the invention will be more readily apparent from the following detailed description, which proceeds with reference to the accompanying drawings.

The color photodetector apparatus with multi-primary pixels of the invention can be achieved by present standard CMOS technology without any process change. The advantages are low cost and high throughput, and the optical thin film based color filter process can be omitted.

The invention comprises P-type (or N-type) semiconductor substrate, $N^+$ polar area (or $P^+$ polar area) formed in P-type (or N-type) semiconductor substrate, optical-electrical conversion area formed between $N^+$ polar area (or $P^+$ polar area) and P-type (or N-type) semiconductor substrate, dielectric layer formed on P-type (or N-type) semiconductor substrate, and metal layer formed on the dielectric layer. There is a metal hole on the metal layer above the optical-electrical conversion area. The metal hole is designed as the sub-wavelength structure of incident light, so that the light can not penetrate through metal hole directly. The surface plasma resonance effect is used to guide the energy of incident light into the optical-electrical conversion area under metal layer.

The invention can be applied for the photodetector. The energy of incident light is guided from the metal electrode into the inside of semiconductor photodetector through the resonance of surface plasmon polaritons, in order to increase the quantum efficiency. Meantime, the filling factor of photodetector is raised. The surface plasma effect of metal structure can also be used to increase the external quantum efficiency of element.

The color photodetector with multi-primary pixels of the invention can be high light absorption efficiency. Different period of hole-array on metal connecting wire of conventional photodetector is used to integrate the surface plasma effect and semiconductor photodetector. The incident light with specific wavelength regimes can be detected by the photodetector.

The invention uses the existing CMOS process to integrate the semiconductor photodetectors and extra color filters. The invention can substitute the additional process of conventionally detecting red, green, and blue light, which is to substitute the additional process of producing color filter films on the detector.

Upon manufacturing the periodic hole array on the hole shape metal connecting wire of photodetector, the invention can manufacture the hole shape metal connecting wire at the same time. The same photo mask and metal etching process can be used to save the manufacturing time and to reduce the manufacturing cost.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention firstly will be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

The invention relates to a color photodetector with multi-primary pixels. Different period of hole-array on metal connecting wire of conventional photodetector is used to integrate the surface plasma effect and photodetector to detect the incident light with specific wavelength regimes.

Figure 1:
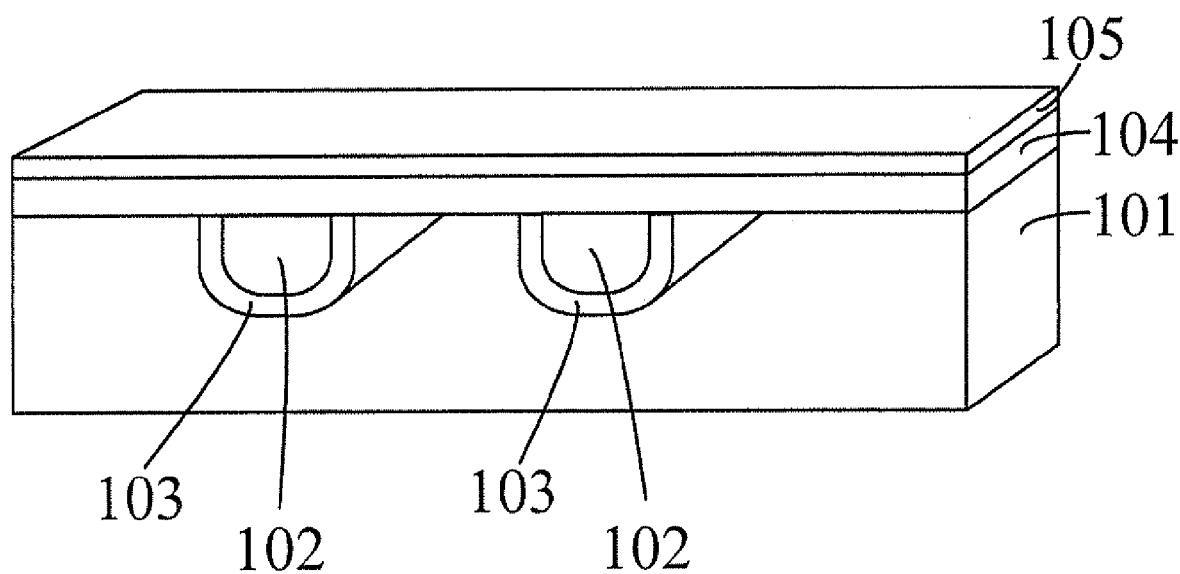
FIG. 1 is schematically illustrating the conventional structure of photodetector.
Figure 2:
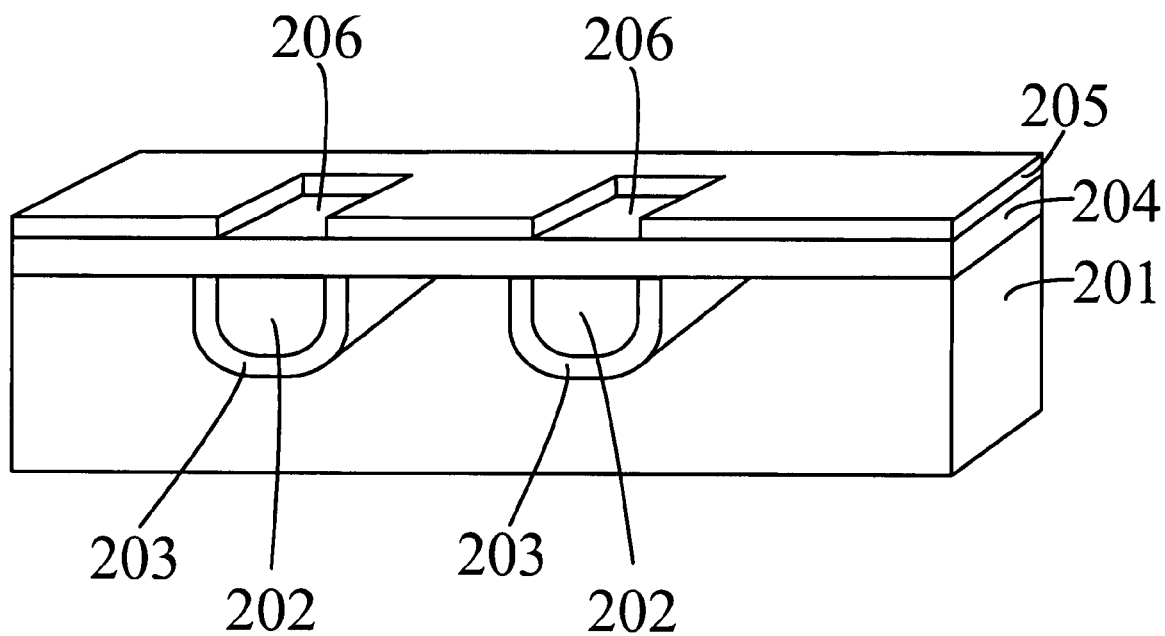
FIG. 2 is schematically illustrating the first embodiment of the invention.

As shown in FIG. 2, this invention relates to a color photodetector apparatus with multi-primary pixels, the first embodiment is described in detail as follows:

Firstly a P-type semiconductor substrate 201 is provided as the substrate.

Then, an $N^+$ polar area 202 is formed into the P-type semiconductor substrate 201.

An optical-electrical conversion area 203 is formed between $N^+$ polar area 202 and P-type semiconductor substrate 201. A dielectric layer 204 is formed on P-type semiconductor substrate 201, which is normally selected from the group of doped silicon dioxide, silicon nitride and silicon oxynitride and the above-mentioned combinations, and undoped silicon dioxide, silicon nitride and silicon oxynitride and the above-mentioned combinations.

Finally, a metal layer 205 is formed on dielectric layer 204, which is normally composed of the metal with good conductivity, such as aluminum, copper etc. The metal layer 205 is used as a detector terminal, there is a metal hole 206 in metal layer 205 on optical-electrical conversion area 203. The metal hole is designed as the sub-wavelength structure of incident light. Due to the surface plasma resonance effect, it will not shield the light, and it can become the channel of light.

Figure 3:
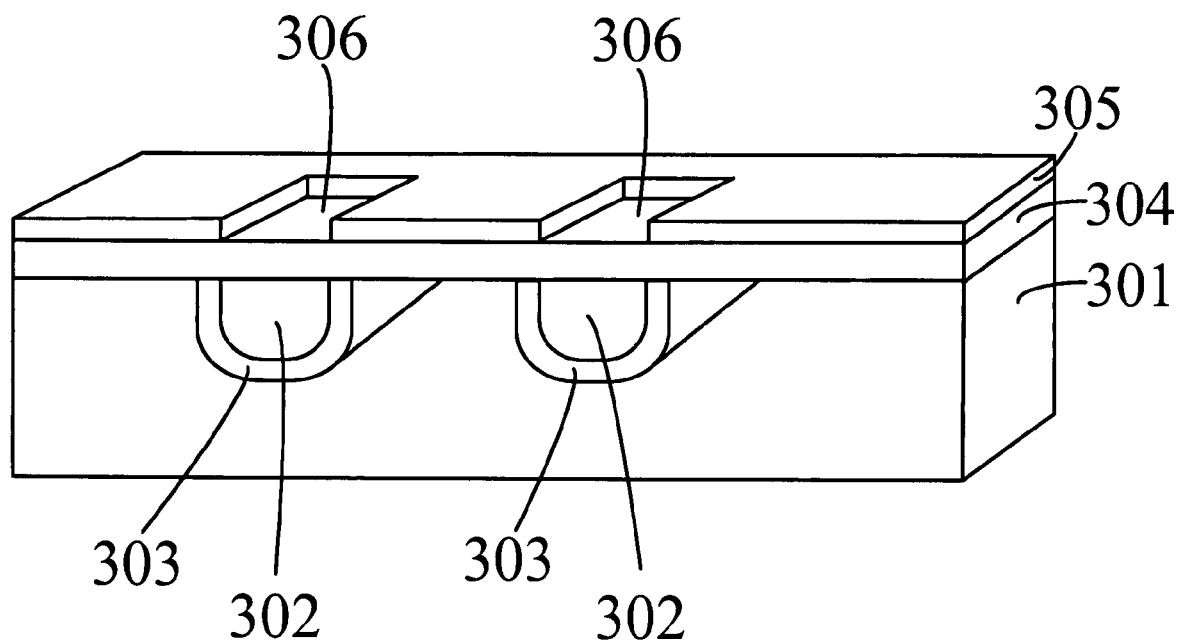
FIG. 3 is schematically illustrating the second embodiment of the invention.

As shown in FIG. 3, the invention relates to a color photodetector apparatus with multi-primary pixels, the second embodiment is described in detail as follows:

Firstly an N-type semiconductor substrate 301 is provided as the substrate.

Then, a $P^+$ polar area 302 is formed into the N-type semiconductor substrate 301.

An optical-electrical conversion area 303 is formed between $P^+$ polar area 302 and N-type semiconductor substrate 301. A dielectric layer 304 is formed on N-type semiconductor substrate 301, which is normally selected from the group of doped silicon dioxide, silicon nitride and silicon oxynitride and the above-mentioned combinations, and undoped silicon dioxide, silicon nitride and silicon oxynitride and the above-mentioned combinations.

Finally, a metal layer 305 is formed on dielectric layer 304, which is normally composed of the metal with good conductivity, such as aluminum, copper etc. The metal layer 305 is used as a detector terminal, where there is a metal hole 306 in metal layer 305 on optical-electrical conversion area 303. The metal hole is designed as the sub-wavelength structure of incident light. Due to the surface plasma effect, it will not shield the light, and it can become the channel of light.

The preferred embodiment for the above various semiconductor substrate will be selected from the silicon based semiconductor and the III-V compound semiconductor.

As shown in FIG. 2 and FIG. 3, the calculation of regressed transmittance for the area of transmitting hole, this invention can obtain the regressed transmittance at near infrared ray section upon the area is over 350%. It means when the light irradiate to the opaque metal surface, the penetration of energy can be achieved by the resonance of surface plasmon polaritons.

Figure 4:
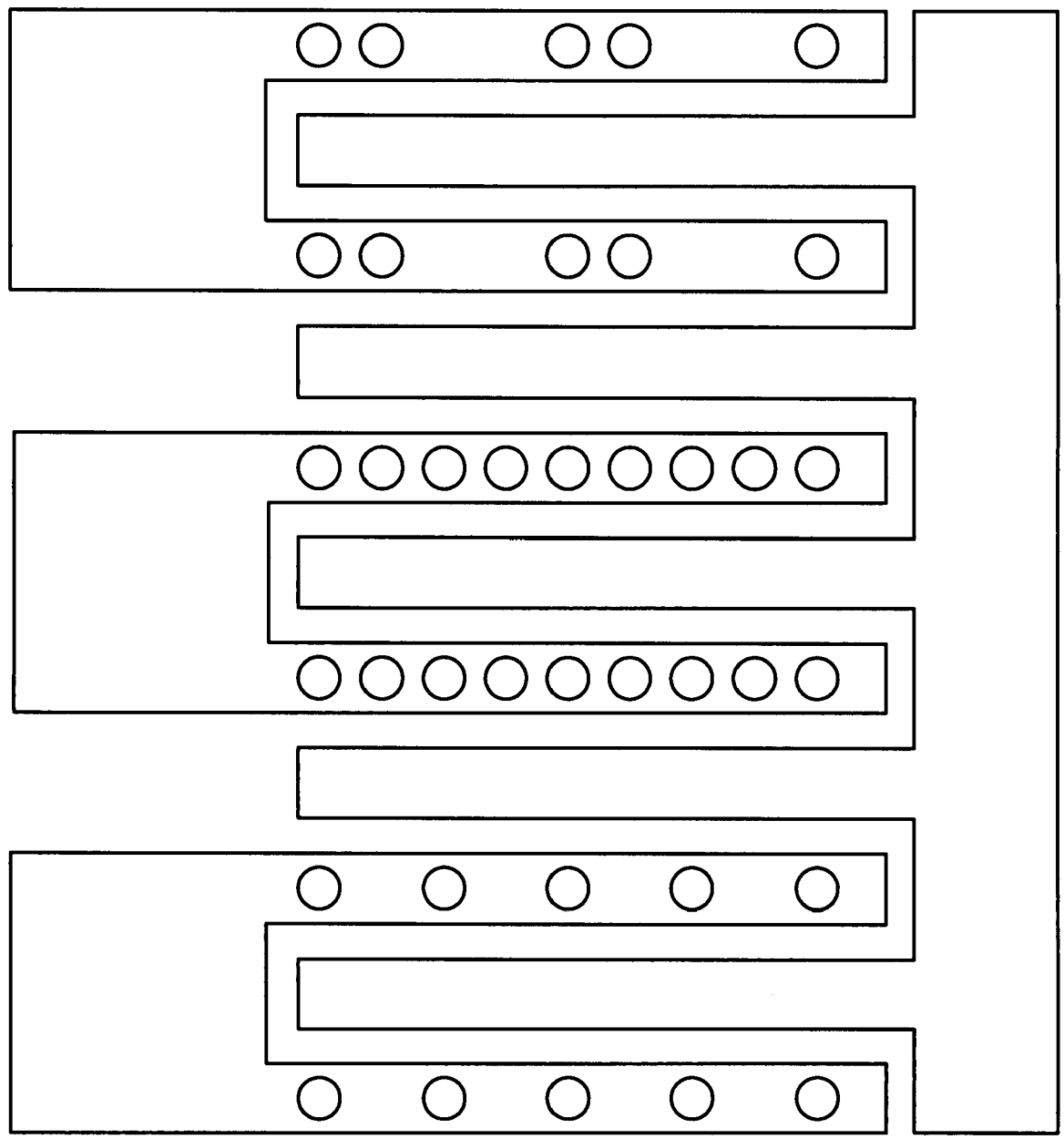
FIG. 4 is schematically illustrating the top view of the invention.

FIG. 4 shows the top view for the color photodetector with multi-primary pixels of the invention. It reveals that various metal holes are distributed in periodic way, including different possible distribution way. Though the circular diagram is used in the Figure, it is not limited to the circular diagram.

Figure 5:
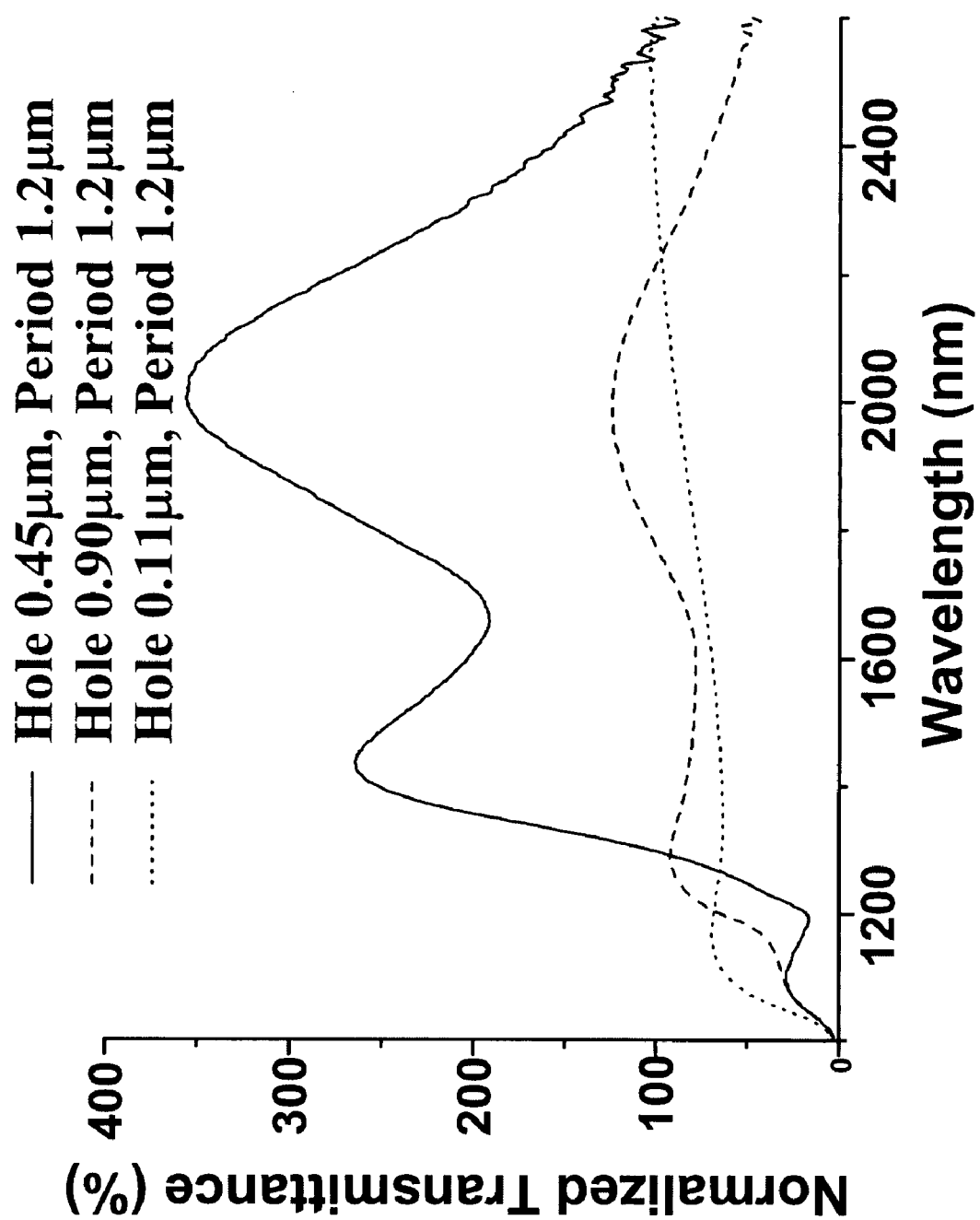
FIG. 5 is schematically illustrating the actual experimental result of the first embodiment.

FIG. 5 shows the actual testing result of the first embodiment. The Y-axis is the transmittance, and the X-axis is the wavelength. The size of hole is about from 0.2 μm to 10 μm and the period is 1.2 μm.

Figure 6:
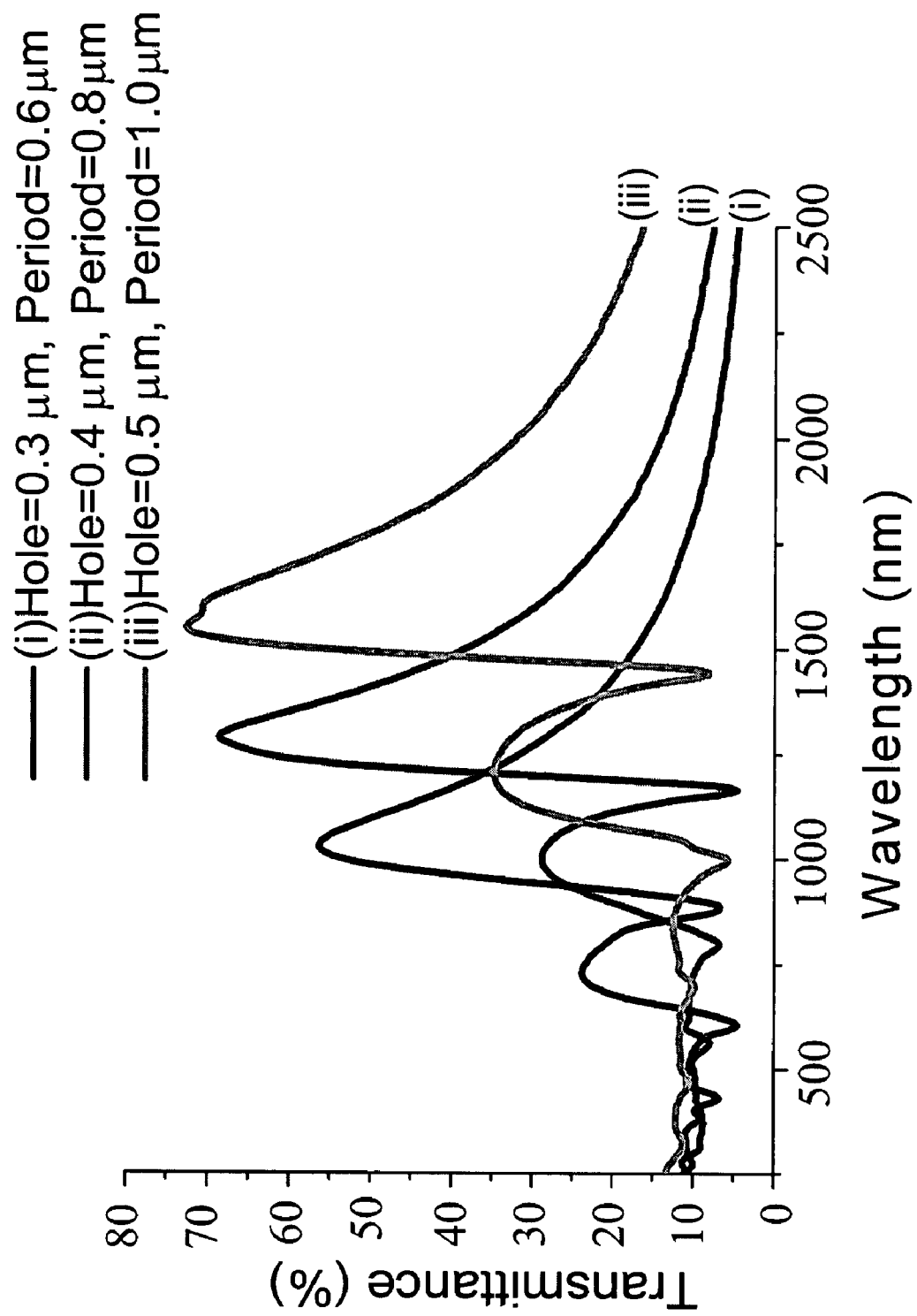
FIG. 6 is schematically illustrating the actual experimental result of the second embodiment.

FIG. 6 shows the actual testing result of the second embodiment. The Y-axis is the transmittance, and the X-axis is the wavelength. The size of hole is about from 0.2 μm to 10 μm and the period is 0.6, 0.8, and 1.0 μm.

If the conventional industrial CMOS manufacturing process is used, there is silicon-based oxide at the bottom of the hole shape metal connecting wire, its advantage is that it can provide the basic refractive index matching environment for the generation of surface plasma effect. Because the narrowest metal wire is about 0.4 μm to 0.8 μm in standard CMOS manufacturing process (such as from 0.35 μm CMOS manufacturing process), the hole shape metal connecting wire has the periodic or non-periodic hole array, which exists after standard CMOS manufacturing process.

The surface plasma resonance effect has many different sorts of photoelectric characteristics. The gain of transmittance for the sub-wavelength nanostructure on metal film has been discussed comprehensively. At specific wavelength, the transmittance of metal hole can be increased to several times to several orders, which is far above the value calculated from the optical diffraction theory. The reinforcement of transmittance is generated by the resonance of surface plasmon polaritons between the incident light and the nanostructure of metal surface.

The surface plasma effect is generated between the metal and different dielectric medium, such as the interface between air and silicon-based oxide. When the light irradiates on the metal surface, it will generate the polarized electric field on the metal surface. The incident light can be considered as an electromagnetic wave with optical wave frequency. The incident light can transfer along the metal and different dielectric medium, such as the interface between air and silicon-based oxide. It means although the incident light irradiates on the metal surface, it still concentrates at the interface between metal and oxide.

If the diameter of metal hole is less than or equal to 0.4 μm, the sub-wavelength structure of visible light can be formed. If the wavelength of incident light is larger than 400 nm, most of the incident light will be shielded. That is to say only the light met the resonance wavelength of surface plasmon polaritons is allowable to pass through the metal layer.

In this structure, when the energy of incident light meets the condition of surface plasma resonance effect, the incident light irradiated on the metal surface will transfer along the interface between metal and silicon-based dielectrics. If a suitable depletion region is arranged in the transfer route of surface plasma wave, an additional photoelectric output will be generated, which can improve the photodetection ability and filling factor of photodetector. The surface plasma wave can be adjusted by the period of hole-array, which can only generated at specific wavelength of red, green, or blue light. The basic semiconductor photodetector can be combined to form the triple-primary pixels with high efficiency.

In addition, it is known that the energy gap of silicon-based material is about 1.12 eV, so the device of the invention can detect the visual light and near infrared ray with the wavelength less than 1100 nm.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A color with multi-primary pixels photodetector apparatus having periodic metal hole array by using a generation area of surface plasma resonance effect, comprising:
    a N-type semiconductor substrate;
    a $P^+$ polar area formed in the N-type semiconductor substrate;
    an optical-electrical conversion area formed between the $P^+$ polar area and the N-type semiconductor substrate;
    a dielectric layer formed on the N-type semiconductor substrate; and
    a metal layer formed on the dielectric layer, the metal layer being used as a color photodetector terminal, and the metal layer being selected from a group consisting of aluminum and copper on the optical-electrical conversion area having a periodic metal hole array, wherein a size of a metal hole for the periodic metal hole array being about from 0.2 µm to 10 µm and a size of a period for the periodic metal hole array being about 0.6 µm, 0.8 µm, and 1.0 µm, which being a generation area of surface plasma resonance effect.

2. The apparatus according to claim 1, wherein the dielectric layer are selected from a group consisting of doped silicon dioxide, silicon nitride, silicon oxynitride and the above-mentioned combinations.

3. The apparatus according to claim 1, wherein the dielectric layer are selected from a group consisting of un-doped silicon dioxide, silicon nitride, silicon oxynitride and the above-mentioned combinations.

4. A color with multi-primary pixels photodetector apparatus having non-periodic metal hole array by using a generation area of surface plasma resonance effect, comprising:
    a N-type semiconductor substrate;
    a $P^+$ polar area formed in the N-type semiconductor substrate;
    an optical-electrical conversion area formed between the $P^+$ polar area and the N-type semiconductor substrate;
    a dielectric layer formed on the N-type semiconductor substrate; and
    a metal layer formed on the dielectric layer, the metal layer being used as a color photodetector terminal, and the metal layer being selected from a group consisting of aluminum and copper on the optical-electrical conversion area having a non-periodic metal hole array, wherein a size of a metal hole for the non-periodic metal hole array being about from 0.2 µm to 10 µm and a size of a period for the non-periodic metal hole array being about 0.6 µm, 0.8 µm, and 1.0 µm, which being a generation area of surface plasma resonance effect.

5. The apparatus according to claim 4, wherein the dielectric layer are selected from a group consisting of doped silicon dioxide, silicon nitride, silicon oxynitride and the above-mentioned combinations.

6. The apparatus according to claim 4, wherein the dielectric layer are selected from a group consisting of un-doped silicon dioxide, silicon nitride, silicon oxynitride and the above-mentioned combinations.

* * * * *